United States Patent
Kim

(10) Patent No.: US 6,576,374 B1
(45) Date of Patent: Jun. 10, 2003

(54) MASK BLANK AND METHOD OF FABRICATING PHASE SHIFT MASK FROM THE SAME

(75) Inventor: Yong-hoon Kim, Anyang (KR)

(73) Assignee: Samsung Electronics Co., Ltd., Suwon (KR)

( * ) Notice: Subject to any disclaimer, the term of this patent is extended or adjusted under 35 U.S.C. 154(b) by 200 days.

(21) Appl. No.: 09/605,429

(22) Filed: Jun. 29, 2000

(30) Foreign Application Priority Data

Jul. 2, 1999 (KR) .............................. 99-26551

(51) Int. Cl.$^7$ .............................. G03F 9/00; G03C 5/00
(52) U.S. Cl. .............................. 430/5; 430/323
(58) Field of Search .................. 430/5, 296, 322, 430/323, 324

(56) References Cited

U.S. PATENT DOCUMENTS

| | | | |
|---|---|---|---|
| 4,657,648 A | | 4/1987 | Nagarekawa et al. |
| 5,139,922 A | * | 8/1992 | Watanabe et al. ............ 430/296 |
| 5,348,826 A | * | 9/1994 | Dao et al. ..................... 430/5 |
| 5,482,799 A | * | 1/1996 | Isao et al. ..................... 430/5 |
| 5,858,582 A | | 1/1999 | Mitsui |
| 6,020,269 A | * | 2/2000 | Wang et al. ................. 438/717 |

FOREIGN PATENT DOCUMENTS

| | | |
|---|---|---|
| EP | 0 807 851 A1 | 11/1997 |
| EP | 0 838 726 A1 | 4/1998 |
| JP | 5-113655 | 4/1993 |
| JP | 6-95358 | 4/1994 |
| JP | 7-128840 | 5/1995 |
| JP | 8-76353 | 3/1996 |
| WO | WO97/04360 | 2/1997 |

OTHER PUBLICATIONS

Gillian A. M. Reynolds et al., "TiSi–nitride attenuating phase–shift photomask for 193 nm lithography," Part of the BACUS Symposium on Photomask Technology and Management, Sep. 1998, SPIE vol. 3546, pp. 514–523.

* cited by examiner

Primary Examiner—Mark F. Huff
Assistant Examiner—Saleha R. Mohamedulla
(74) Attorney, Agent, or Firm—Volentine Francos, PLLC

(57) ABSTRACT

A mask blank includes a transparent substrate, a light shield layer formed on the upper surface of the transparent substrate, and a multi-functional protective layer formed on the light shield layer. To make a phase shift mask from the blank, the protective layer is patterned, and the light shield layer is etched using the protective layer pattern as an etch mask. The phase shift region is formed by etching a groove in the second region of the substrate while the protective layer pattern protects the light shield layer. Therefore, undesirable residue is prevented from forming at the bottom of the groove constituting the phase shift region. The method also entails patterning a photosensitive layer on the protective layer, and patterning the protective layer by using the patterned photosensitve layer as a mask. In this case, the structure is cleaned so that no residue remains on the exposed portions of the light shield layer.

14 Claims, 4 Drawing Sheets

MASK BLANK AND METHOD OF FABRICATING PHASE SHIFT MASK FROM THE SAME

BACKGROUND OF THE INVENTION

1. Field of the Invention

The present invention relates to a phase shift mask used to fabricate semiconductor devices, and to a method of fabricating a phase shift mask from a mask blank. More particularly, the present invention relates to a mask blank and to a method of fabricating an alternating phase shift mask from the mask blank.

2. Description of the Related Art

The degree of integration of a semiconductor device is proportional to the resolution power of exposure equipment used to fabricate the semiconductor device. Accordingly, research has been conducted with an aim towards increasing the resolution power of semiconductor exposure equipment. The optical source of the exposure equipment is an important factor dictating the resolution power of the equipment. Therefore, much of the above-mentioned research centers around exposure equipment having an optical source which emits light of a short wavelength.

The resolution power of the exposure equipment must be in accordance with the degree of integration of the semiconductor devices being fabricated. To avoid the enormous expense that would be associated with providing new equipment for fabricating more highly integrated devices, a method of increasing the resolution power of conventional exposure equipment is used.

The method can be accomplished by using a phase shift mask, for example, an alternating phase shift mask.

A conventional method of fabricating an alternating phase shift mask, and problems thereof will now be described with reference to FIGS. 1 through 7. Referring first to FIG. 1, a chromium layer 12 is formed on a transparent substrate 10, and photosensitive film patterns 14 which expose predetermined areas on the chromium layer 12 are formed on the chromium layer 12. The entire surface of the chromium layer 12 is etched using the photosensitive patterns 14 as an etch mask. Then, the photosensitive film patterns 14 are removed.

Referring to FIG. 2, chromium layer patterns 12a are formed on the transparent substrate 10 by the etching. Also, the exposed areas of the chromium layer 12 are etched away, thereby exposing the surface 13 of the transparent substrate 10 at a first area A1 and a second area A2. The first area A1 is a phase non-shift area, and the second area A2 will eventually constitute a phase shift area.

Referring to FIG. 3, photosensitive film patterns 16 are formed on the resultant structure on which the chromium layer patterns 12a are formed, so that the first area A1 of the transparent substrate 10 and the chromium layer patterns 12a are covered while the second area A2 is exposed.

Referring to FIG. 4, a groove 18 is formed in the transparent substrate 10 at the second area A2, using the photosensitive film patterns 16 as an etch mask. In this way, the phase shift area is formed on the transparent substrate 10. The formation of the groove 18 makes the second area A2 of the transparent substrate 10 thinner than the first area A1.

The photosensitive film patterns 16 are removed, resulting in a phase shift mask including the first area A1 and the second area A2 as shown in FIG. 5.

However, according to the conventional method of fabricating a phase shift mask as described above, material is left on the surface of the transparent substrate 10 and at the bottom of the groove 18 in the processes of forming the chromium layer patterns 12a and forming the groove 18 in the transparent substrate 10.

For example, residue from a previous step, e.g., the step of forming the photosensitive film patterns 14, can remain on the exposed surfaces of the chromium layer 12. The residue obstructs the etching of the exposed portions of the chromium layer 12. The residue in fact acts as an etching mask. Therefore, although the surfaces 13 and 13a of the transparent substrate 10 are exposed by removing the exposed portions of the chromium layer 12, a defect (not shown), that is, unwanted material, including chromium, is formed on the exposed surfaces 13 and 13a of the transparent substrate 10. The defect is repaired by a laser. In this process, the chromium absorbs the laser, is melted, and is sublimated, whereby it is removed. Simultaneously, heat absorbed from the laser is transmitted to the portion of the transparent substrate 10 lying beneath the chromium. Consequently, the exposed surfaces 13 and 13a of the transparent substrate 10 are fused and then solidified. The change in physical state makes the material of the transparent substrate 10 in the neighborhood of the exposed surfaces 13 and 13a different from that of other portions of the transparent substrate 10. Thus, what often happens is that material of the exposed portions 13 and 13a of the transparent substrate 10 does not react to an etch gas or is slow to react thereto in the process of forming the groove 18 in the transparent substrate 10. As a result, a portion 20 (FIG. 6) of the substrate 10 remains unetched or only partially etched after the groove 18 is completely formed. The portion 20 is a defect because it changes the phase of light passing through the phase shift area A2. Also, light is diffracted at the sides of the portion 20 of the substrate, thus adversely affecting the formation of patterns using the mask.

Referring to FIG. 7, in the conventional method of fabricating a phase shift mask, a residual layer 22 is also formed at the phase shift area A2 as a result of the process of etching the groove 18 in the substrate 10. The material of the residual layer 22 is a compound of chromium (Cr) and fluorine (F), formed by the reaction of the etch gas, which is used to form the groove 18, with the chromium layer patterns 12a. The residual layer 22 inhibits the transmittance of light incident upon the second region A2 and abnormally changes the phase of light passing therethrough. Also, the residual layer 22 is formed prior to the completion of the groove 18 and impedes the etching of the substrate 10 during the process of forming the groove 18. Accordingly, the residual layer 22 prevents a complete forming of the groove 18.

SUMMARY OF THE INVENTION

Accordingly, a first object of the present invention is to solve the above-described problems by providing a mask blank by which defects can be prevented from being formed on a substrate during a process of fabricating a phase shift mask, and in particular, an alternating phase shift mask, from the mask blank.

To achieve the first object, the present invention provides a mask blank comprising a substrate which is transparent to incident light (exposure light of a given wavelength), a light shield layer formed on the entire surface of the transparent substrate, and a protective layer formed on the entire surface of the light shield layer. The protective layer, among other things, protects the light shield layer from etch gas during a process of etching the substrate to form a phase shift region.

The light shield layer is prevented by the protective layer from reacting with the etch gas, whereby the groove in the substrate formed as a result of the etching is free of residue. The protective layer itself produces no residue by-product when exposed to the etch gas.

In this respect, the protective layer can be formed of a material which adheres well to the light shield layer and evaporates in the presence of the etch gas. For instance, when the light shield layer comprises chromium, and the etch gas contains fluorine, the protective layer can be molybdenum silicon oxynitride (MoSiON).

A second object of the present invention is to provide a method of fabricating a phase shift mask, wherein the method prevents undesirable residue from accumulating on the substrate of the mask at the bottom of a groove constituting the phase shift region.

To achieve the second object, the present invention provides a method of fabricating a phase shift mask comprising the steps of forming a light shield layer on the upper surface of a transparent substrate, forming a protective layer pattern on the light shield layer to expose portions of the light shield layer, etching the exposed portions of the light shield layer using the protective layer pattern as an etch mask to in turn expose first and second regions of the substrate, and forming a phase shift region by etching a groove in the second region of the substrate while the protective layer pattern protects the light shield layer from the etchant.

Once the first and second regions of the substrate are exposed, the substrate is coated with a photosensitive layer. The photosensitive layer is a photoresist layer for an electron beam (e-beam). The photosensitive layer is patterned to expose the second region. The groove can then be etched in the second region using the photosensitive layer pattern as an etch mask. The etching is controlled until the thickness of the second region of the substrate is reduced to the desired phase shift thickness.

A marginal part of the protective layer pattern bordering the second region is exposed when the photosensitive layer pattern is formed. The exposed part of the protective layer is also etched while the groove is being formed.

The etching is an anisotropic dry-etching process preferably using an etch gas of $CHF_3$, $SF_6$ or $CF_4$. The protective layer is formed of a material which evaporates in the presence of the etch gas, such as molybdenum silicon oxynitride (MoSiON).

A third object of the present invention is to provide a method of fabricating a phase shift mask, wherein the method prevents undesirable residue of a light shield layer from remaining on a region of a substrate from which the light shield layer should have been etched away completely.

To achieve the third object, the present invention provides a method of fabricating a phase shift mask comprising the steps of sequentially forming a light shield layer and a protective layer over the entire surface of a substrate, coating the entire surface of the protective layer with a layer of photosensitive material, patterning the photosensitive layer, etching the protective layer using the patterned photosensitive layer as an etch mask to expose portions of the light shield layer, removing the patterned photosensitive layer and then cleaning the resultant structure so that no residue remains on the exposed portions of the light shield layer, etching away the exposed portions of the light shield layer using the patterned protective layer as an etch mask to in turn expose first and second regions of the substrate, and forming a phase shift region at the second region of the substrate.

A charging prevention layer can be formed over the photosensitive layer, and the charging prevention layer and the photosensitive layer can be sequentially patterned using an electron beam. In this case, the etching of the protective layer is carried out using the patterned charging layer and the patterned photosensitive layer collectively as an etch mask, and the patterned charging prevention layer is removed along with the patterned photosensitive layer.

This method can also be carried out under the particulars summarized above in connection with the second object of the present invention, whereby both of the advantages associated with the prevention of residue from forming at the bottom of the groove in the phase shift region, and of preventing residue from remaining adhered to the exposed portion of the substrate which is to be etched to form a phase shift region, can be realized.

BRIEF DESCRIPTION OF THE DRAWINGS

The above and other objects, features and advantage of the present invention will become more apparent from the following detailed description of preferred embodiments thereof made with reference to the attached drawings, of which.

DETAILED DESCRIPTION OF THE PREFERRED EMBODIMENTS

Figure 1:
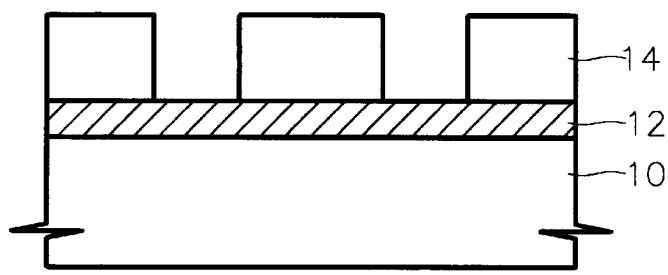
FIGS. 1 through 5 are cross-sectional views illustrating a conventional method of fabricating an alternating phase shift mask.
Figure 2:
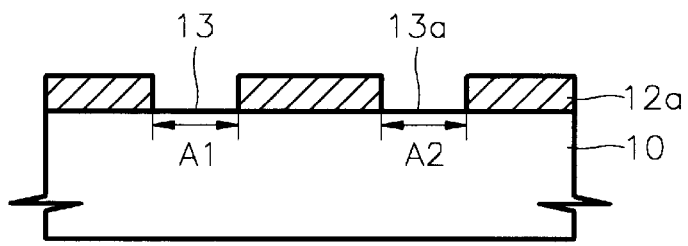
Figure 3:
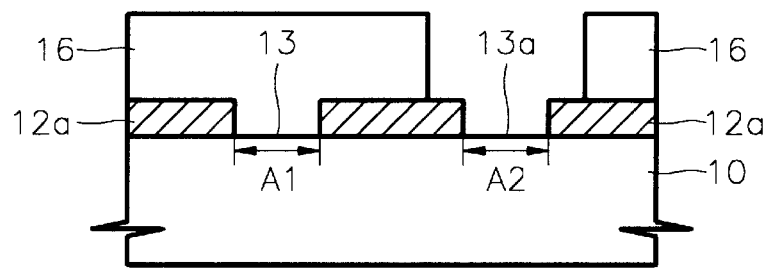
Figure 4:
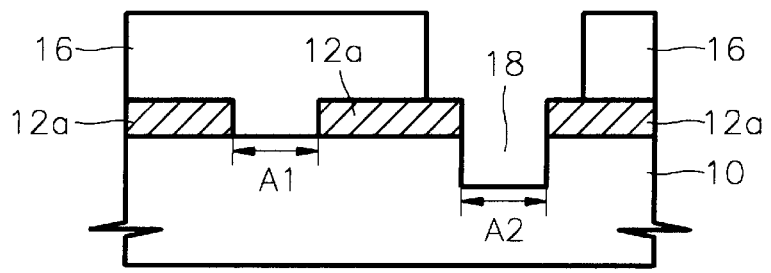
Figure 5:
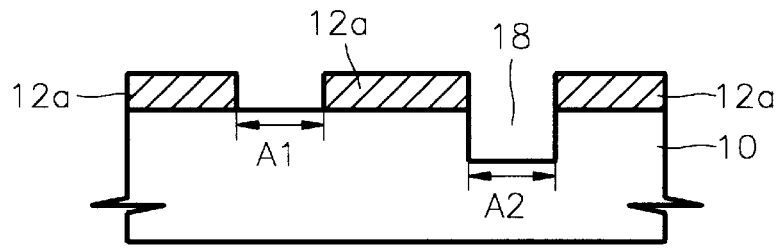
Figure 6:
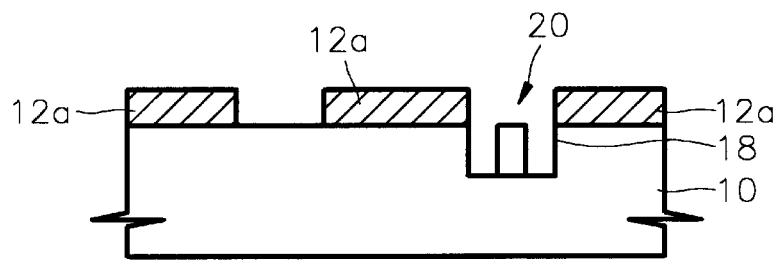
FIGS. 6 and 7 are cross-sectional views illustrating defects in an alternating phase shift mask fabricated by the conventional method.
Figure 7:
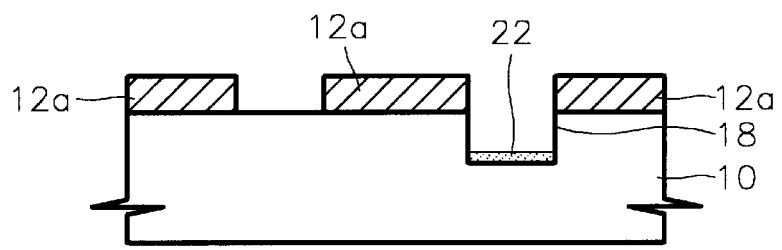

The present invention will now be described in more detail below with reference to the accompanying drawings. In the drawings, the thicknesses of layers or regions are exaggerated for the sake of clarity. Furthermore, like reference numerals denote like elements throughout the drawings.

Hereinafter, a first embodiment of a mask blank according to the present invention will be described. The mask blank is useful in forming optical masks such as a Levenson-type phase shift mask.

<First Embodiment>

Figure 8:
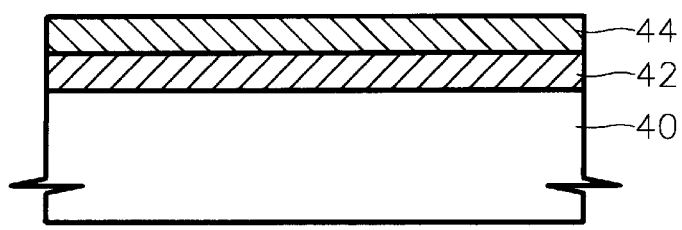
FIGS. 8 and 9 are cross-sectional views of first and second embodiments of mask blanks, respectively, according to the present invention.

Referring to FIG. 8, a light shield layer 42 is formed on the entire upper surface of a substrate 40. The substrate 40 is preferably made of quartz which is optically transparent with respect to incident light. The light shield layer 42 is made of chromium (Cr), and can completely shield a light incident to a photoresist on the substrate 40. The thickness of the light shield layer 42 is selected based on its composition and that of the incident light to ensure that a complete shielding occurs. For example, when the light shield layer 42 is made of chromium, the thickness thereof is preferably at least 500 Å.

Next, a protective layer 44 is formed on the entire upper surface of the light shield layer 42. The protective layer 44 is a multi-functional layer which protects the light shield layer 42 and additionally shields a light incident to a photoresist on the substrate 40. That is, the protective layer 44 prevents the surface of the light shield layer 42 from being exposed and reacting to an etch gas while a groove for forming a phase shift region is formed in the substrate 40. A reaction between the etch gas and the light shield layer 42 is prevented to, in turn, prevent the formation of undesirable byproduct of the reaction at the bottom of the groove being formed by the etching process. The protective layer 44 is preferably formed of a material which evaporates in the presence of the etch gas used to form the groove in the substrate 40. The evaporative material preferably comprises silicon (Si), for example, molybdenum silicon oxynitride (MoSiON). The thickness of the protective layer 44 varies according to the etch selectivity between the protective layer 44 and the substrate 40 with respect to the etch gas. In this case, the thickness of the protective layer 44 is preferably about 200 to 3000 Å. However, when the protective layer 44 is made of another material, the thickness thereof is selected according to the etch selectivity of the material with the substrate 40, the depth of a groove to be formed in the substrate 40, and the wavelength of light incident upon the substrate 40.

<Second Embodiment>

The second embodiment of the mask blank is for use in making a phase shift mask using an electron beam.

Figure 9:
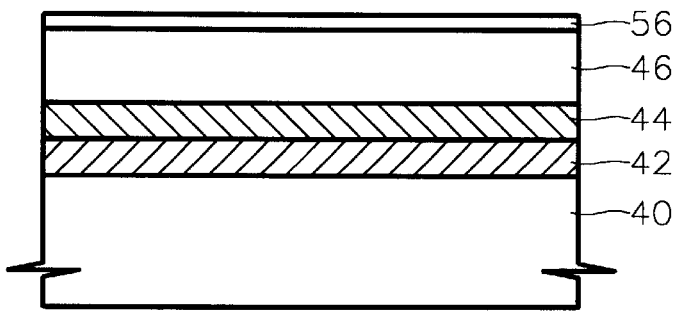

Referring to FIG. 9, the light shield layer 42 and the protective layer 44 are sequentially formed over the entire upper surface of the transparent substrate 40. A photosensitive layer 46 and a charging prevention layer 56 are then sequentially formed also over the entire upper surface of the protective layer 44. The transparent substrate 40, the light shield layer 42 and the protective layer 44 are the same as those of the first embodiment. The photosensitive layer 46 is a photoresist layer for the electron beam, and the charging prevention layer 56 prevents the surface of the photosensitive layer 46 from being charged by an electron beam during a process of patterning the photosensitive layer 46.

Methods of fabricating a phase shift mask using the first and second embodiments of the mask blanks will now be described.

<First Embodiment>

Figure 10:
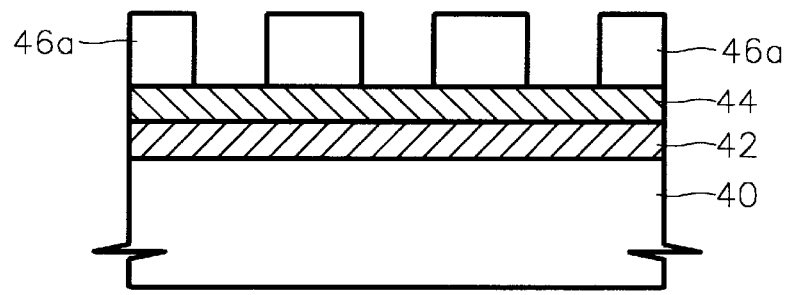
FIGS. 10 through 15 are cross-sectional views illustrating a first embodiment of a method of fabricating an alternating phase shift mask according to the present invention.

Referring to FIG. 10, first, the light shield layer 42 and the protective layer 44 are sequentially formed on the optically transparent quartz substrate 40. More specifically, chromium (Cr) is sputtered onto the substrate 40 until a light shield layer 42 of chromium is formed to a predetermined thickness, i.e., so that the light shield layer 42 can completely optically shield a photosensitive layer on a semiconductor substrate from light incident upon the substrate 40 of the mask. What is meant by "completely optically shield" is that light shield layer 42 is substantially opaque with respect to the light, i.e., the intensity of any light incident upon the substrate 40 and transmitted by the light shield layer 42 is so low that it cannot photosensitize the photosensitive layer even if the incident light passes through the light shield layer 42. As mentioned earlier, when the light shield layer 42 is of chromium, it is formed to a thickness of at least 500 Å.

The protective layer 44 also is preferably formed by sputtering. When the protective layer 44 is of molybdenum silicon oxynitride (MoSiON), the material is preferably sputtered to a thickness of about 200 to 3000 Å. However, if another material is used, the method of forming the protective layer 44 can be appropriately selected based on the material used.

If the exposure equipment comprises a KrF optical source, the exposure light is a deep ultraviolet generally having a wavelength 248 nm. In this case, if the protective layer 44 is formed of molybdenum silicon oxynitride having a thickness of about 1800 Å, only about 0.25 to 0.64% of light incident upon the protective layer 44 is transmitted. Thus, the protective layer 44 can be considered to optically block light like the light shield layer 42. That is, the protective layer 44 itself can be considered a second light shield layer.

Thereafter, the entire upper surface of the protective layer 44 is coated with a photosensitive layer. The photosensitive layer is patterned to form photosensitive layer patterns 46a on the protective layer 44. The photosensitive layer is a photoresist layer which may be used for an electron beam (e-beam). Thus, those portions of the surface of the protective layer 44 between adjacent photosensitive layer patterns 46a are exposed. Regions of the substrate 40 under the exposed surfaces of the protective layer 44 are phase nonshift regions or phase shift regions.

Figure 11:
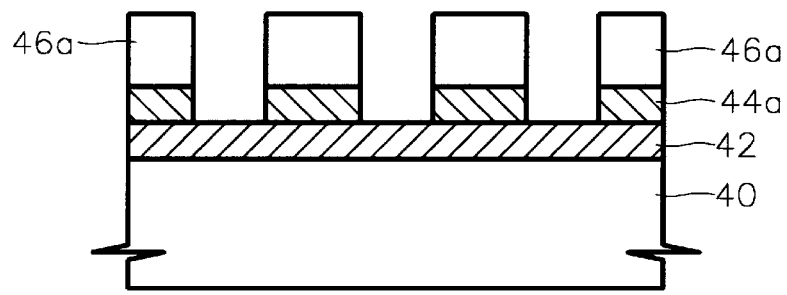

FIG. 11 shows a step of forming protective layer patterns 44a by patterning the protective layer 44. To be more specific, the entire surface of the protective layer 44 is etched using the photosensitive layer patterns 46a as an etch mask. Consequently, the exposed portions of the protective layer 44 are etched away so that portions of the light shield layer 42 therebeneath are exposed. In this way, the protective layer patterns 44a are formed.

Figure 12:
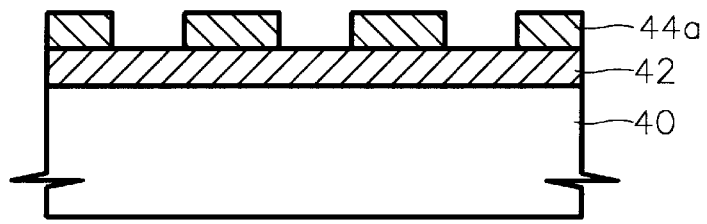

Referring to FIG. 12, the photosensitive layer patterns 46a are removed. Then, the resultant structure from which the photosensitive layer patterns 46a have been removed is cleaned to thereby remove residue from the exposed portions of the light shield layer 42. Such residue is generated while the photosensitive layer patterns 46a and the protective layer patterns 44a are being formed.

Figure 13:
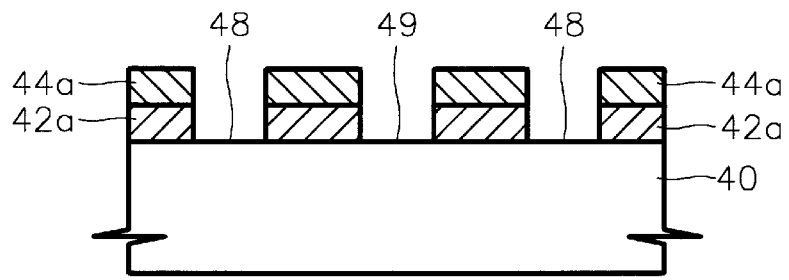

Referring to FIG. 13, the entire surface of the light shield layer 42 is anisotropically dry-etched using the protective layer patterns 44a as an etch mask. In some circumstances, wet-etching can be performed using an acid containing aqueous chemical. Alternately, dry-etching can be performed using gas mixture containing $Cl_2$ and $O_2$. The etching is performed until the substrate 40 is exposed. The exposed portions of the light shield layer 42 are etched away to expose first and second regions 48 and 49 of the substrate 40, thereby forming light shield layer patterns 42a. The etching of the light shield layer 42 is performed in a state in which the exposed portions of the light shield layer 42 are clean, so that no residual material of the light shield layer 42, for example, chromium, remains at the first and second exposed regions 48 and 49 of the substrate 40. Residual material of the protective layer 44, for example, molybdenum silicon oxynitride, may remain on the first and second exposed regions 48 and 49 of the substrate 40. However, the molybdenum silicon oxynitride residue can be easily removed without damaging the substrate 40, by using a focused ion beam (FIB) or a laser.

This fact is demonstrated by comparing the melting points of the following materials:

Cr: 2093° C.

Mo: 2617° C.

$Mo+Mo_3Si$: 2025 (±40) °C.

$Mo_3Si+Mo_5Si_3$: 2025 (±40) °C.

$Mo_5Si_3$: 2190 (±20) °C.

$Mo_5Si_3+MoSi_2$: 1900 (±40) °C.

$MoSi_2$: 2030 (±20) °C.

MoSi$_2$+Si: 1400 (±10) °C.

Si: 1414° C.

A compound of Mo—Si is very stable. The melting point of the compound is controlled by controlling the composition ratio of the compound. Also, if O and N gases are contained in the compound, the melting point is further lowered.

The first and second exposed regions 48 and 49 of the substrate 40 constitute a phase non-shift region and a phase shift region, respectively. Alternatively, the first regions 48 can be made into phase shift regions while the second region 49 is left as a phase non-shift region.

Figure 14:
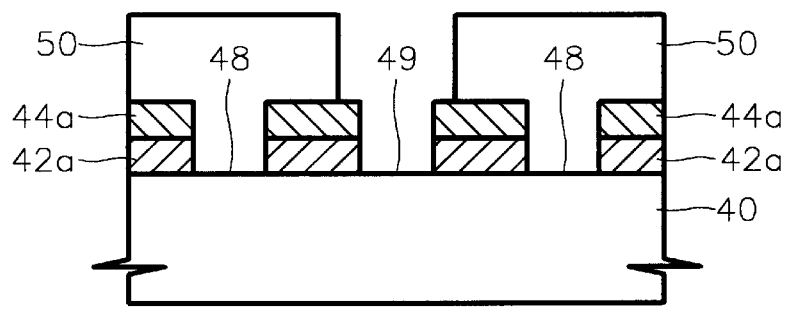

Referring to FIG. 14, the entire upper surface of the resultant structure on which the protective layer patterns 44a and the light shield layer patterns 42a are formed is coated with a photosensitive layer. Here, the photosensitive layer is a photoresist layer. Then, the photosensitive layer is patterned to form photosensitive layer patterns 50 which expose the second region 49 of the substrate 40. The masks aligned to form the photosensitive layer patterns 50 allow for parts of the protective layer patterns 44a adjacent the second region 49 to be exposed.

Figure 15:
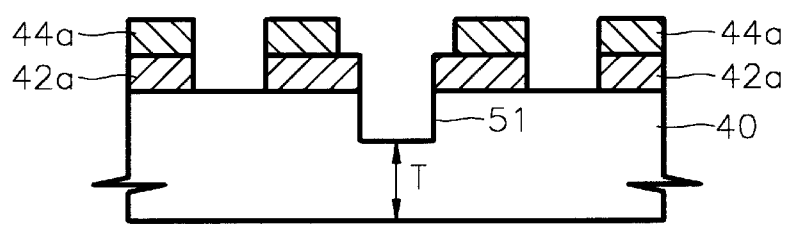

Referring to FIG. 15, the entire surface of the substrate 40 is anisotropically dry-etched using the photosensitive layer patterns 50 as an etch mask. An etch gas of a halide gas like a fluorine (F)-group is used for the anisotropic dry etching process. For example, the etch gas is preferably one selected from the group consisting of CHF$_3$, SF$_6$, CF$_4$ and other flouride gases. However, any gas which can anisotropically etch the substrate 40 can be used. The second exposed region 49 of the substrate 40 is etched to form a groove 51. The second region 49 thus constitutes a phase shift region.

The phase shift characteristics of the second region 49 are determined by the thickness (T) of the resultant substrate 40 in which the groove 51 is formed. Thus, the depth of the groove 51 determines the thickness (T) of the portion of the substrate 40 in which the groove 51 is formed. As described above, the depth of the groove 51 is designed for the wavelength of light incident upon the substrate 40 and the material of the substrate 40.

For example, assuming that the thickness (T) shown in FIG. 15 is appropriate for a substrate made of optically transparent quartz, when the substrate 40 is instead made of a transparent material having a refractive index which is smaller than the refractive index of quartz, the thickness (T) of the second region 49 of the substrate 40 will be greater than that shown in FIG. 15. On the other hand, when the substrate 40 is made of a transparent material having a refractive index which is greater than the refractive index of quartz, the thickness (T) of the second region 49 of the substrate 40 will be less than that shown in FIG. 15.

Next, the exposed portions of the protective layer patterns 44a continuously react to the etch gas while the groove 51 is being formed. Accordingly, the exposed portions of the protective layer patterns 44a become thinner or can be completely etched away as shown in FIG. 15, depending on the etch selectivity of the protective layer 44 and the substrate 40 with respect to the etch gas. The protective layer 44 should thus be formed to an appropriate thickness in consideration of the desired depth of the groove 51, and the etch selectivity between the substrate 40 and the protective layer 44 with respect to the etch gas used to form the groove 51.

For example, if the etch selectivity between the substrate 40 and the protective layer 44 is 2 to 1, the protective layer 44 could be formed to a thickness which is half the desired depth of the groove 51 whereupon the exposed portions of the protective layer patterns 44a would be just completely etched away at the time the groove 51 is completed. Because the exposed portions of the protective layer patterns 44a are present over the chromium layer pattern 42a during the entire time the etch gas is forming the groove 51, no residual material is left at the bottom of the groove 51. On the other hand, in the conventional method of fabricating a phase shift mask, material formed by the reaction of the etch gas and the chromium is left at the bottom of the groove of the phase shift region, thereby lowering the transmittance of incident light and abnormally changing the phase of the incident light passing through the substrate.

<Second Embodiment>

The second embodiment of the method of the present invention is for fabricating a phase shift mask using an electron beam.

Referring once again to FIG. 9, as in the first embodiment, the light shield layer 42 and a protective layer 44 are sequentially formed over the entire upper surface of the substrate 40. Then, the photosensitive layer 46 and the charging prevention layer 56 are sequentially formed over the entire surface of the protective layer 44.

Figure 16:
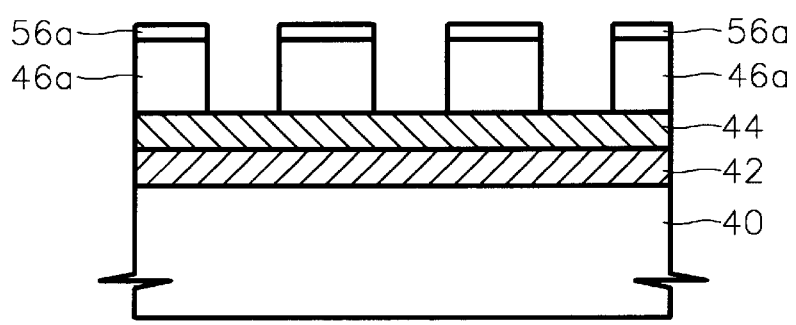
FIG. 16, together with FIGS. 12 through 15, illustrates a second embodiment of a method of fabricating an alternating phase shift mask according to the present invention.

Referring now to FIG. 16, the charging prevention layer 56 and the photosensitive layer 46 are sequentially patterned using an electron beam, thereby forming photosensitive layer patterns 46a and charging prevention layer patterns 56a which expose predetermined regions of the protective layer 44. Then, the protective layer 44 is etched using the charging prevention layer patterns 56a and the photosensitive layer patterns 46a as an etch mask, similar to the etching step of the first embodiment shown in FIG. 11. The process then proceeds in the same manner as the first embodiment, i.e., with the steps shown and described with respect to FIGS. 12–15. Note, the charging prevention layer patterns 56a and the photosensitive layer patterns 46a can be removed after the protective layer patterns 44a are formed.

Although the present invention has been described above in detail in connection with preferred embodiments thereof, such details are not to be construed as limiting. For example, although the protective layer has been described as being made of molybdenum silicon oxynitride, other evaporative silicon-containing materials can be used. The light shield layer 42 and the protective layer 44 can be formed by deposition methods other than sputtering, such as chemical vapor deposition (CVD) methods. The mask blank according to the present invention can be used to fabricate an alternating phase shift mask that is different from the alternating phase shift mask shown in FIG. 15. Also, the mask blanks shown in FIGS. 8 and 9 can be made into phase shift masks using fabrication methods different from those specifically described, such as by using a halftone phase shift mask fabrication method. Hence, the true spirit and scope of the present invention resides in all such variations as encompassed by the appended claims.

What is claimed is:

1. A method of fabricating a phase shift mask comprising the steps of:

forming a light shield layer on the entire surface of a substrate, the light shield layer being substantially opaque to exposure light of a given wavelength and the substrate being transparent to the light;

forming a protective layer pattern on the light shield layer;

etching portions of the light shield layer using the protective layer pattern as an etch mask to expose first and second regions of the substrate; and while the protective layer pattern remains on a portion of the light shield layer forming the boundary of the second region, forming a phase shift region by etching the second region of the substrate with an etchant to form a groove in the substrate at the second region thereof, wherein the protective layer prevents an interaction between the etchant and the light shield layer at the boundary of the second region.

2. The method of claim 1, wherein the step of forming the light shield layer comprises forming a light shield layer of chromium and having a thickness of at least 500 Å on the substrate.

3. The method of claim 1, wherein the step forming the phase shift region comprises:
   coating the substrate having the first and second exposed regions with a layer of photosensitive material;
   patterning the photosensitive layer to expose the second region of the substrate;
   etching the exposed second region using the photosensitive layer pattern as an etch mask until the thickness of the substrate at the second region thereof is suitable for effecting a phase shift when the mask is in use; and
   subsequently removing the photosensitive layer pattern.

4. The method of claim 3, wherein the etching comprises anisotropically dry-etching the second region of the substrate with an etch gas, and the step of forming the protective layer comprises forming the protective layer of a material which evaporates in reaction to the etch gas during the etching of the second region of the substrate.

5. The method of claim 4, wherein the step of forming the protective layer comprises forming the protective layer of molybdenum silicon oxynitride to a thickness within a range of from 200 to 3000 Å.

6. The method of claim 4, wherein the etch gas is one selected from the group consisting of $CHF_3$, $SF_6$, $CF_4$ and other fluoride gases.

7. The method of claim 3, wherein the patterning of the photosensitive layer leaves one portion of the protective layer pattern forming the boundary of the second region covered with photosensitive material and a marginal part of said portion of the protective layer pattern directly adjacent the second region exposed.

8. The method of claim 7, wherein the etching comprises anisotropically dry-etching the second region of the substrate with an etch gas, and the protective layer is of a material that is etchable by the etch gas, whereby said marginal part is etched during the etching of the second region of the substrate with the etch gas.

9. A method of fabricating a phase shift mask comprising the steps of:
   sequentially forming a light shield layer and a protective layer over the entire upper surface of a substrate, the light shield layer being substantially opaque to exposure light of a given wavelength and the substrate being transparent to the light;
   coating the entire upper surface of the protective layer with a first layer of photosensitive material;
   patterning the first photosensitive layer to expose portions of the protective layer;
   etching the protective layer using the patterned photosensitive layer as an etch mask to form a patterned protective layer that exposes portions of the light shield layer;
   removing the patterned photosensitive layer;
   cleaning the resultant structure to remove any residue of the patterned photosensitive layer and underlying protective layer remaining on the exposed portions of the light shield layer;
   etching away the exposed portions of the light shield layer using the patterned protective layer as an etch mask to expose first and second regions of the substrate;
   coating the substrate having the first and second exposed regions with a second layer of photosensitive material;
   patterning the second photosensitive layer coating the substrate to expose the second region of the substrate;
   etching the exposed second region using the second photosensitive layer pattern as an etch mask until the thickness of the substrate at the second region thereof is suitable for effecting a phase shift when the mask is in use; and
   subsequently removing the second photosensitive layer pattern.

10. The method of claim 9, and further comprising the steps of:
    forming a charging prevention layer over the first photosensitive layer; and
    patterning the charging prevention layer using an electron beam prior to the step of patterning the first photosensitive layer, and
    wherein the step of patterning the first photosensitive layer is also carried out using an electron beam, the etching of the protective layer is carried out using the patterned charging prevention layer and the patterned first photosensitive layer collectively as an etch mask, and the patterned charging prevention layer is removed along with the patterned first photosensitive layer.

11. The method of claim 9, wherein the etching of the exposed second region comprises dry-etching using an etch gas, and the forming of the protective layer comprises forming the protective layer of a material which evaporates in reaction to the etch gas during the etching of the second region of the substrate.

12. The method of claim 11, wherein the forming of the protective layer comprises forming the protective layer of molybdenum silicon oxynitride to a thickness within a range of from 200 to 3000 Å.

13. The method of claim 11, wherein the etch gas is one selected from the group consisting of $CHF_3$, $SF_6$, $CF_4$ and other fluoride gases.

14. The method of claim 9, wherein the patterning of the second photosensitive layer leaves one portion of the protective layer pattern forming the boundary of the second region covered with photosensitive material and a marginal part of said portion of the protective layer pattern directly adjacent the second region exposed.

* * * * *